(12) United States Patent
Kumar et al.

(10) Patent No.: US 11,914,670 B2
(45) Date of Patent: Feb. 27, 2024

(54) METHODS AND SYSTEMS FOR PRODUCT QUANTIZATION-BASED COMPRESSION OF A MATRIX

(71) Applicants: Krtin Kumar, Montreal (CA); Mehdi Rezagholizadeh, Montreal (CA); Peyman Passban, Montreal (CA)

(72) Inventors: Krtin Kumar, Montreal (CA); Mehdi Rezagholizadeh, Montreal (CA); Peyman Passban, Montreal (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 796 days.

(21) Appl. No.: 17/014,712

(22) Filed: Sep. 8, 2020

(65) Prior Publication Data

US 2022/0075843 A1    Mar. 10, 2022

(51) Int. Cl.
| | | |
|---|---|---|
| G06F 17/16 | (2006.01) | |
| G06F 40/284 | (2020.01) | |
| H03M 7/30 | (2006.01) | |
| G06N 3/08 | (2023.01) | |

(52) U.S. Cl.
CPC .......... *G06F 17/16* (2013.01); *G06F 40/284* (2020.01); *G06N 3/08* (2013.01); *H03M 7/70* (2013.01)

(58) Field of Classification Search
CPC ......... G06F 17/16; G06F 40/284; G06N 3/08; G06N 3/063; G06N 3/04; G06N 3/084; G06N 20/00; H03M 7/70; H03M 7/3082; H03M 7/3059

USPC ........................................................ 708/520
See application file for complete search history.

(56) References Cited

U.S. PATENT DOCUMENTS

2017/0213109 A1    7/2017   Moody et al.
2022/0036184 A1*   2/2022   Liu .................... G06N 3/045

FOREIGN PATENT DOCUMENTS

| CN | 105718440 A | 6/2016 |
| CN | 108701453 A | 10/2018 |
| CN | 110168525 A | 8/2019 |
| CN | 110209859 A | 9/2019 |

OTHER PUBLICATIONS

Jegou, H. et al., "Product quantization for nearest neighbor search", IEEE Transactions on Pattern Analysis and Machine Intelligence, 33(1), (2011) 117-128.
Shi, K et al., "Structured Word Embedding for Low Memory Neural Network Language Model", Interspeech, 2018.
(Continued)

*Primary Examiner* — Tan V Mai

(57) ABSTRACT

Methods and systems for compressing a matrix are described. The matrix, having a plurality of rows formed by a respective plurality of vectors, is partitioned into a plurality of submatrices, each submatrix containing sub-vectors from a respective group of one or more contiguous columns of the matrix. For each given submatrix, the sub-vectors are clustered into a plurality of clusters. For each given cluster, a centroid and a variance are computed and stored, based on the sub-vectors belonging to the given cluster. A mapping relating each vector to a respective cluster in each submatrix is stored. The stored centroids, stored variances and stored mapping form a set of compressed data for reconstruction of the matrix.

20 Claims, 6 Drawing Sheets

(56) References Cited

OTHER PUBLICATIONS

Chen, P. et al., "GroupReduce: Block-Wise Low-Rank Approximation for Neural Language Model Shrinking", Advances in Neural Information Processing Systems, 2018.
Ginart, A. et al., "Mixed Dimension Embeddings with Application to Memory-Efficient Recommendation Systems", arXiv preprint arXiv:1909.11810 (2019).
Shu, R. et al., "Compressing Word Embeddings via Deep Compositional Code Learning", (2017) arXiv preprint arXiv:1711.01068.
Hrinchuk, O. et al., "Tensorized Embedding Layers", (2019) arXiv preprint, arXiv:1901.10787.
Vaswani, A. et al., "Attention Is All You Need", Advances in Neural Information Processing Systems (2017), pp. 5998-6008.
Kerdpraop, K. et al., "Weighted K-Means for Density-Biased Clustering", (Aug. 2005), International Conference on Data Warehousing and Knowledge Discovery (pp. 488-497), Springer, Berlin, Heidelberg.

* cited by examiner

METHODS AND SYSTEMS FOR PRODUCT QUANTIZATION-BASED COMPRESSION OF A MATRIX

FIELD

The present disclosure relates to methods and systems for compressing a matrix, including methods and systems for compressing a matrix using product quantization, particularly for natural language processing applications.

BACKGROUND

Product quantization (PQ) is a vector quantization technique that decomposes a high-dimensional vector space into lower-dimensional subspaces (or clusters) and quantizes each cluster (e.g., by taking the centroid of each cluster as representative of all elements of the cluster). PQ has been used as a way to provide faster approximation of a nearest neighbor search. PQ has also been applied to fields such as information retrieval and compression of embedding matrices in natural language processing (NLP). In NLP, an embedding matrix is a matrix containing a plurality of embedding vectors, where each embedding vector is a vector representation of a respective word in a corpus. An embedding matrix may be used to map input data, such as one-hot vector representations of words in the corpus, to embedding vectors to enable a machine learning algorithm to learn a NLP task, such as a translation task for example. Being able to compress an embedding matrix enables more efficient use of memory and processing resources. Compression of an embedding matrix, in the present disclosure, means representing the original embedding matrix using fewer data bits than the original matrix, and from which the embedding matrix can be recovered (possibly with some acceptable loss of information).

However, existing PQ techniques for compression of embedding matrices does not take into account non-uniform distribution of tokens in the corpus vocabulary, which may lead to a less than ideal performance-to-compression ratio. PQ uses the cluster centroid as the fixed representation for all elements inside the cluster, with the result that information about individual elements within the cluster may be lost.

It would be useful to provide a way to compress an embedding matrix, that better preserves information from the original embedding matrix.

SUMMARY

The present disclosure presents example methods and systems for PQ-based compression of matrices. Some drawbacks of conventional PQ compression techniques, for NLP applications in particular, are addressed by examples described herein.

In various examples, techniques are described that enable information about variances of elements in a cluster to be preserved in the compressed data. A stochastic approach to compression is described, in which the centroid and variance of each cluster are stored, and reconstruction of each cluster may be performed by sampling from a Gaussian distribution having the centroid and variance of the cluster.

In some examples, the importance of some vectors relative to others in the matrix are taken into consideration. A weighted K-means clustering approach is described, in which elements of a cluster are weighted according to their relative importance. Weights may be computed based on the frequency of each element in a source dataset (e.g., frequency of each word in a corpus), or based on the Euclidean norm of the vector corresponding to each element (e.g., where each element is a sub-vector of a vector in the matrix).

The examples described herein may be useful to address drawbacks of conventional PQ compression techniques, particularly for NLP applications. For example, the examples described herein may be used to perform non-uniform quantization, which may enable compression that takes into account the relative importance of different embedding vectors based upon respective weights. Using the Euclidean norm to weight each embedding vector may be more useful for NLP applications, rather than simply being weighted based on the frequency of words in a corpus.

Although described in the context of embedding matrices, which may be useful for neural networks trained to perform NLP tasks, examples described herein may be used for compression of any matrix, which may be used for any neural network.

In some example aspects, the present disclosure describes a computing system including: a memory; and a processing device in communication with the memory. The processing device is configured to execute instructions to cause the computing system to: partition a matrix, having a plurality of rows formed by a respective plurality of vectors, into a plurality of submatrices, each submatrix containing sub-vectors from a respective group of one or more contiguous columns of the matrix; for each given submatrix, cluster the sub-vectors of the given submatrix into a plurality of clusters; for each given cluster, compute and store a centroid and a variance based on the sub-vectors belonging to the given cluster; and store a mapping relating each vector to a respective cluster in each submatrix. The stored centroids, stored variances and stored mapping form a set of compressed data for reconstruction of the matrix.

In any of the examples, the matrix may be an embedding matrix, and the plurality of vectors may be a plurality of embedding vectors, each embedding vector being a vector representation of a respective token in a vocabulary of a corpus.

In any of the examples, the matrix may be a layer of a neural network, and the plurality of vectors may be trainable parameters of the neural network.

In any of the examples, the processing device may be configured to execute the instructions to cause the computing system to cluster the sub-vectors using K-means clustering.

In any of the examples, the processing device may be configured to execute the instructions to cause the computing system to cluster the sub-vectors using weighted K-means clustering. The centroid of each given cluster may be computed using element weights to weight each sub-vector of the given cluster.

In any of the examples, each vector of the matrix may represent a respective token in a source dataset, and the element weight for each respective sub-vector of the given cluster may be defined based on frequency of the corresponding token in the source dataset.

In any of the examples, the element weight for each respective sub-vector of the given cluster may be defined based on a Euclidian norm of a corresponding vector in the matrix.

In any of the examples, the processing device may be configured to execute the instructions to cause the computing system to: communicate the set of compressed data to another device, the set of compressed data to be used as input for performing a machine learning task.

In some example aspects, the present disclosure describes a computing system including: a memory; and a processing device in communication with the memory. The processing device is configured to execute instructions to cause the computing system to: obtain a set of compressed data for reconstruction of a matrix, the set of compressed data including a set of centroids and a set of variances, each centroid being associated with a respective cluster, and each variance being associated with a respective cluster, the set of compressed data further including a mapping relating each sub-vector of the matrix to a respective cluster; for each given cluster, generate a reconstructed centroid by sampling from a distribution, the distribution being generated using the centroid and the variance associated with the given cluster; reconstruct each given sub-vector using the reconstructed centroid generated for a relevant cluster, the relevant cluster for the given sub-vector being identified using the mapping; and reconstruct the matrix by concatenating the reconstructed sub-vectors.

In any of the examples, the distribution may be a multivariate Gaussian distribution.

In any of the examples, the set of compressed data may be obtained in a communication from another device.

In any of the examples, the matrix may be an embedding matrix.

In some example aspects, the present disclosure describes a method for compressing a matrix, the method including: partitioning a matrix, having a plurality of rows formed by a respective plurality of vectors, into a plurality of submatrices, each submatrix containing sub-vectors from a respective group of one or more contiguous columns of the matrix; for each given submatrix, clustering the sub-vectors of the given submatrix into a plurality of clusters; for each given cluster, computing and storing a centroid and a variance based on the sub-vectors belonging to the given cluster; and storing a mapping relating each vector to a respective cluster in each submatrix. The stored centroids, stored variances and stored mapping form a set of compressed data for reconstruction of the matrix.

In any of the examples, the matrix may be an embedding matrix, and the plurality of vectors may be a plurality of embedding vectors, each embedding vector being a vector representation of a respective token in a vocabulary of a corpus.

In any of the examples, the matrix may be a layer of a neural network, and the plurality of vectors may be trainable parameters of the neural network.

In any of the examples, the sub-vectors may be clustered using K-means clustering.

In any of the examples, the sub-vectors may be clustered using weighted K-means clustering, and the centroid of each given cluster may be computed using element weights to weight each sub-vector of the given cluster.

In any of the examples, each vector of the matrix may represent a respective token in a source dataset, and the element weight for each respective sub-vector of the given cluster may be defined based on frequency of the corresponding token in the source dataset.

In any of the examples, the element weight for each respective sub-vector of the given cluster may be defined based on a Euclidian norm of a corresponding vector in the matrix.

In any of the examples, the method may include: communicating the set of compressed data to another device, the set of compressed data to be used as input for performing a machine learning task.

In any example embodiment, a method may include any of the steps performed by the computing system described above.

In any example embodiment, a computer-readable medium may include instructions to cause the computing system to perform any of the steps described above.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

In example embodiments disclosed herein, methods and systems are described that enable more effective compression of embedding matrices, particularly for natural language processing (NLP) and speech-related applications. In order for a machine learning algorithm (e.g., neural network) to perform a learned NLP task (e.g., machine language translation, machine text generation, machine text analysis, machine text filtering, machine answer generation, etc.) accurately, it is important that the machine learning algorithm be provided with data (e.g., training data during the training phase, or input data during the inference phase) that provides accurate and sufficient information (that is, "high quality" data). However, at the same time, the size of the data (e.g., in terms of the number of words in the vocabulary) that can be inputted to a machine learning algorithm that performs a NLP task may be limited by the memory and/or processing resources of the computing device (e.g., a handheld or mobile computing device) implementing the machine learning algorithm. Compression of the data may be performed to accommodate such resource limitations. There is often a tradeoff between the amount of compression and the quality of the recovered data that is reconstructed from the compressed data. In various examples, the present disclosure describes methods and systems for compression of embedding matrices that may achieve a better compression-to-quality ratio.

Figure 1:
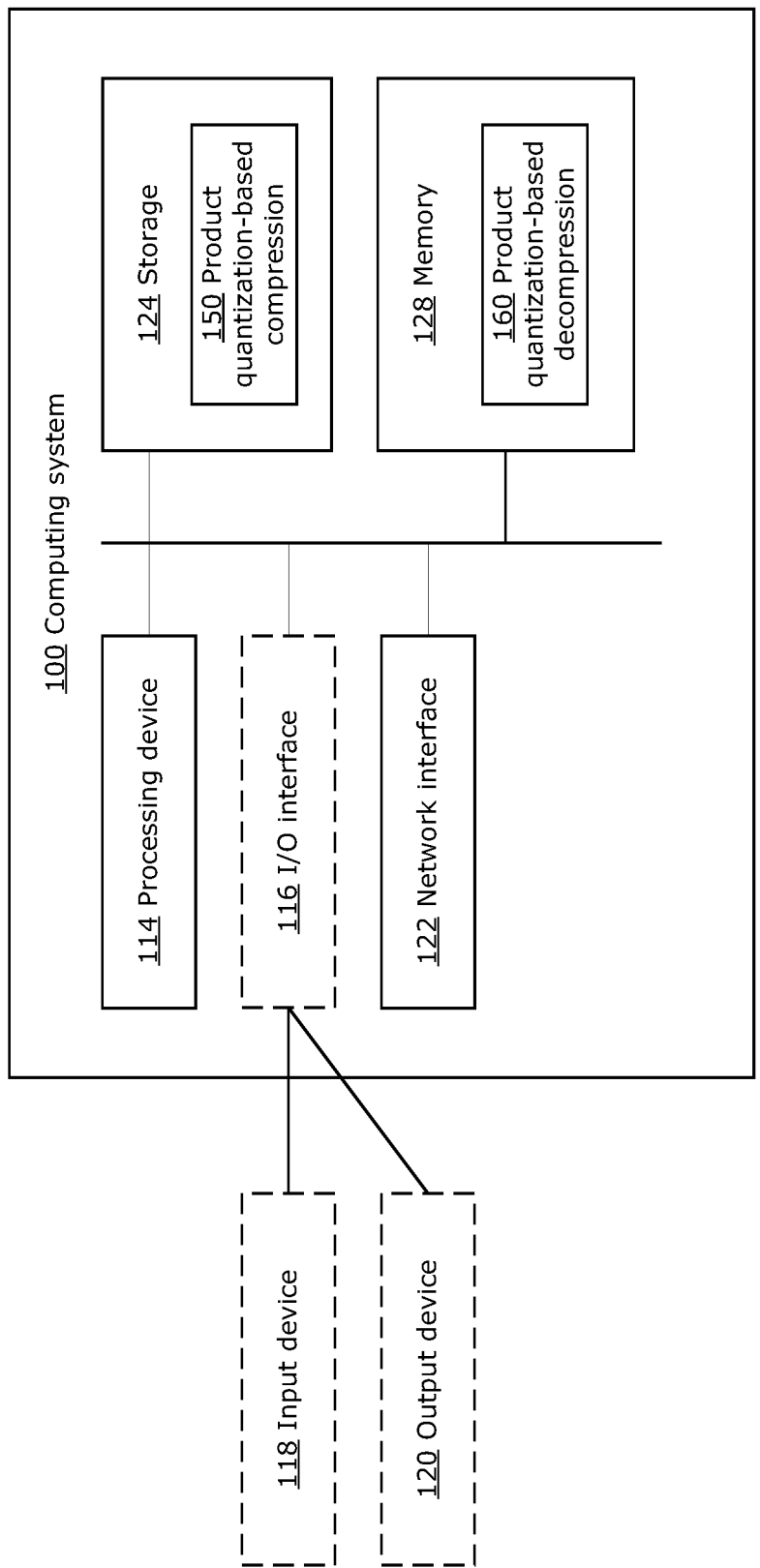
FIG. 1 is a block diagram of an example computing system that may be used to implement example embodiments described herein.

To assist in understanding the present disclosure, FIG. 1 is first discussed.

FIG. 1 is a block diagram illustrating a simplified example implementation of a computing system 100 suitable for implementing embodiments described herein. Examples of the present disclosure may be implemented in other computing systems, which may include components different from those discussed below. For example, in some examples, the computing system 100 may be an artificial intelligence (AI) chip, an application specific integrated circuit (ASIC), or a field programmable gate array (FPGA) that includes circuitry to compress an embedding matrix in accordance with examples described herein.

Although FIG. 1 shows a single instance of each component, there may be multiple instances of each component in the computing system 100.

The computing system 100 may be, for example, a server side device comprising one or more servers located in a datacenter, or a cloud computing system, where an embedding matrix may be compressed in accordance with examples described herein. In some examples, the computing system 100 may be a user device, such as a client device/terminal, user equipment/device (UE), mobile station (STA), smartphone, laptop, computer, tablet, smart device, machine type communications device, smart (or connected) vehicles, or consumer electronics device, among other possibilities. In some examples, the computing system 100 may be an edge computing device.

The computing system 100 may include one or more processing devices 114, such as a processor, a microprocessor, a digital signal processor, an application-specific integrated circuit (ASIC), a field-programmable gate array (FPGA), a dedicated logic circuitry, a dedicated artificial intelligence processor unit, a tensor processing unit, a neural processing unit, a hardware accelerator, or combinations thereof. The computing system 100 may also include one or more optional input/output (I/O) interfaces 116, which may enable interfacing with one or more optional input devices 118 and/or optional output devices 120.

In the example shown, the input device(s) 118 (e.g., a keyboard, a mouse, a microphone, a touchscreen, and/or a keypad) and output device(s) 120 (e.g., a display, a speaker and/or a printer) are shown as optional and external to the server. In other example embodiments, there may not be any input device(s) 118 and output device(s) 120, in which case the I/O interface(s) 116 may not be needed.

The computing system 100 may include one or more network interfaces 122 for wired or wireless communication with other computing devices in a network. The network interface(s) 122 may include wired links (e.g., Ethernet cable) and/or wireless links (e.g., one or more antennas) for intra-network and/or inter-network communications.

The computing system 100 may also include one or more storage units 124, which may include a mass storage unit such as a solid state drive, a hard disk drive, a magnetic disk drive and/or an optical disk drive.

The computing system 100 may include one or more memories 128, which may include a volatile or non-volatile memory (e.g., a flash memory, a random access memory (RAM), and/or a read-only memory (ROM)). The non-transitory memory(ies) 128 may store instructions for execution by the processing device(s) 114, such as to carry out example embodiments described in the present disclosure. The memory(ies) 128 may include other software instructions, such as for implementing an operating system and other applications/functions.

In some example embodiments, the storage unit(s) 124 (or memory(ies) 128) may include software instructions for execution by the processing device 114 to implement a module for product quantization-based compression 150 (e.g., as a preprocessor for compression), as discussed further below. In some example embodiments, the memory (ies) 128 may alternatively or additionally include software instructions for execution by the processing device 114 to implement a module for product quantization-based decompression 160, as discussed further below. In some example embodiments, the computing system 100 may additionally or alternatively execute instructions from an external memory (e.g., an external drive in wired or wireless communication with the server) or may be provided executable instructions by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

To assist in understanding the present disclosure, a discussion of some terminology used in NLP is now presented.

Figure 2:
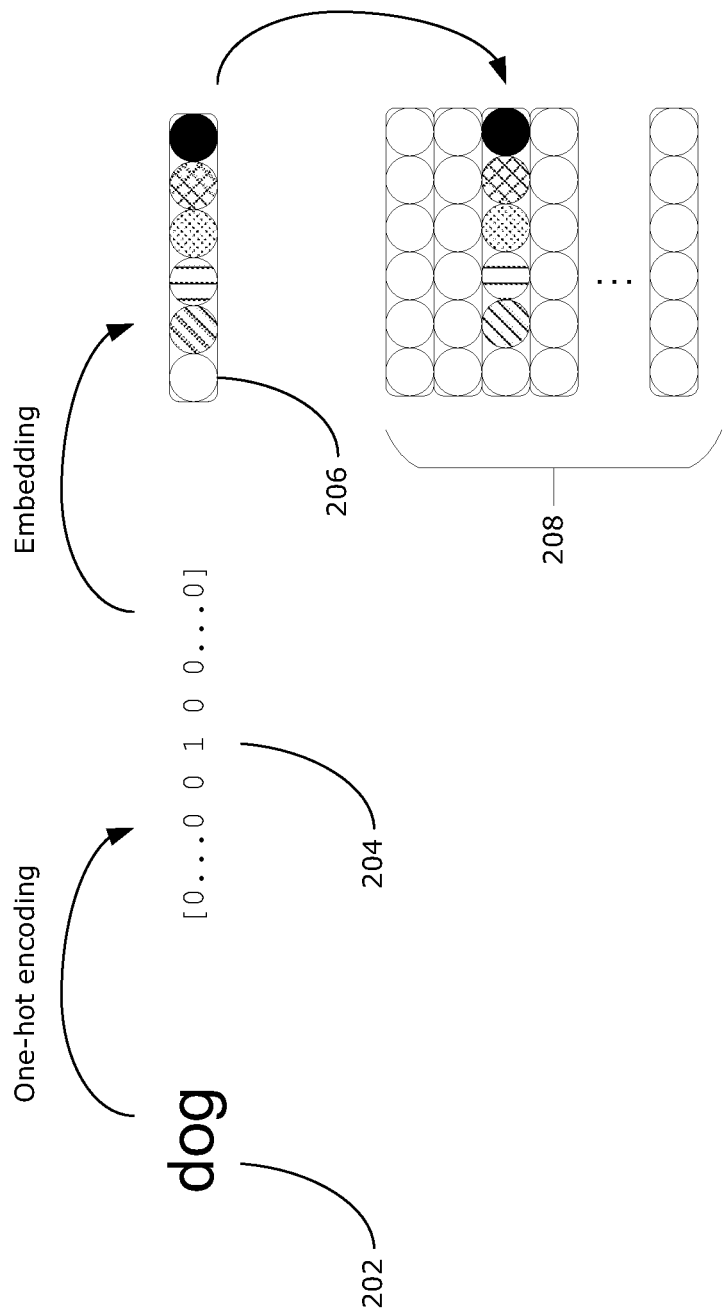
FIG. 2 illustrates an example of how a token in a corpus is processed into an embedding vector of an embedding matrix.

FIG. 2 illustrates a simplified example of how a token from a corpus may be processed into an embedding vector, and subsequently used to form an embedding matrix. A corpus refers to a collection of text documents representing a language domain (typically a single language). The corpus comprises a plurality of words, and the words typically have a relationship to each other based on their relative positions in a sequence of words (e.g., in a sentence). The corpus may also include non-words, such as symbols (e.g., "?", "!" and other punctuation), whitespace or numeric characters.

Tokenization is a NLP technique that separates the corpus into units referred to as tokens. Tokens are frequently words, with non-words discarded. In FIG. 2, a token 202 "dog" is illustrated. The token 202 may be encoded into a sparse vector representation such as a one-hot vector 204. In the one-hot vector 204, there is only one non-zero entry (typically with a value of "1") at the index corresponding to the token 202 and all other entries are zero. The one-hot vector 204 may be further processed into a dense vector representation of the token 202, referred to as an embedding vector 206 (or simply embedding). An embedding vector 206 is a vector representation of the token 202 that is denser than the one-hot vector 204 (i.e., having more non-zero values) and that enables semantically-related tokens to be closer to each other in a vector space (i.e. a collection of embedding vectors). Unsupervised representation learning (e.g., autoencoders) may be used to learn the embedding vector 206 (e.g., learn the weights of each entry, or dimension, in the embedding vector 206) for a given token 202. In FIG. 2, the embedding vector 206 is represented as a 1×6 vector, with different shading to represent the different weights of each dimension in the embedding vector 206.

The entire corpus may be similarly processed to generate a plurality of embedding vectors 206, each having the same number of dimensions (also referred to as having the same number of features, or same number of entries). The embedding vectors 206 may each form a row of an embedding matrix 208. In this way, the embedding matrix 208 represents the vector space (i.e. the collection of all embedding vectors), or latent code space, that represents the vocabulary contained in the corpus as well as the semantic relationships in the vocabulary. Although the embedding vector 206 in this example is shown with a length of 6, and the corresponding embedding matrix 208 has 6 columns, the embedding vector 206 may have any length, and is typically longer than 6. Accordingly, the embedding matrix 208 may similarly have any number of columns and typically has more than 6 columns. The number of rows of the embedding matrix 208 corresponds to the number of embedding vectors 206 generated from the tokens 202 contained in the corpus. As can be appreciated, for a large corpus having a large vocabulary, the embedding matrix 208 can be very large (e.g., having over 50,000 rows and over 200 columns).

A large embedding matrix 208, although containing useful information about the corpus, may not be practical for use by devices having limited memory and/or processing resources (e.g., handheld or mobile devices). Product quantization (PQ) is an existing technique that has been used for compression of embedding matrices. Some discussion of existing PQ techniques is now provided.

Consider an embedding matrix $E \in R^{|V| \times n}$, where V is the vocabulary set contained in the corpus, $|V|$ is the vocabulary size (i.e., number of distinct tokens represented in the embedding matrix), and n is the embedding vector size (i.e., length of each embedding vector). The first step in PQ is to partition the embedding matrix E into a known number g of groups of columns. Each group may be referred to as a submatrix of the embedding matrix. The g submatrices of the embedding matrix E may each be denoted as $G_1$, where i is an integer, $1 \leq i \leq g$ and $$G_i \in R^{|V| \times \frac{n}{g}}.$$

The embedding matrix thus may be expressed as a concatenation of the submatrices as follows: $E=[G_1, G_2, \ldots G_9]$. Each partition $G_1$ consists of sub-vectors from each row of the embedding matrix. Each sub-vector has length $$\frac{n}{g}.$$

Each partition $G_i$ is clustered using K-means clustering into c clusters, forming c additional partitions within that partition.

Figure 3:
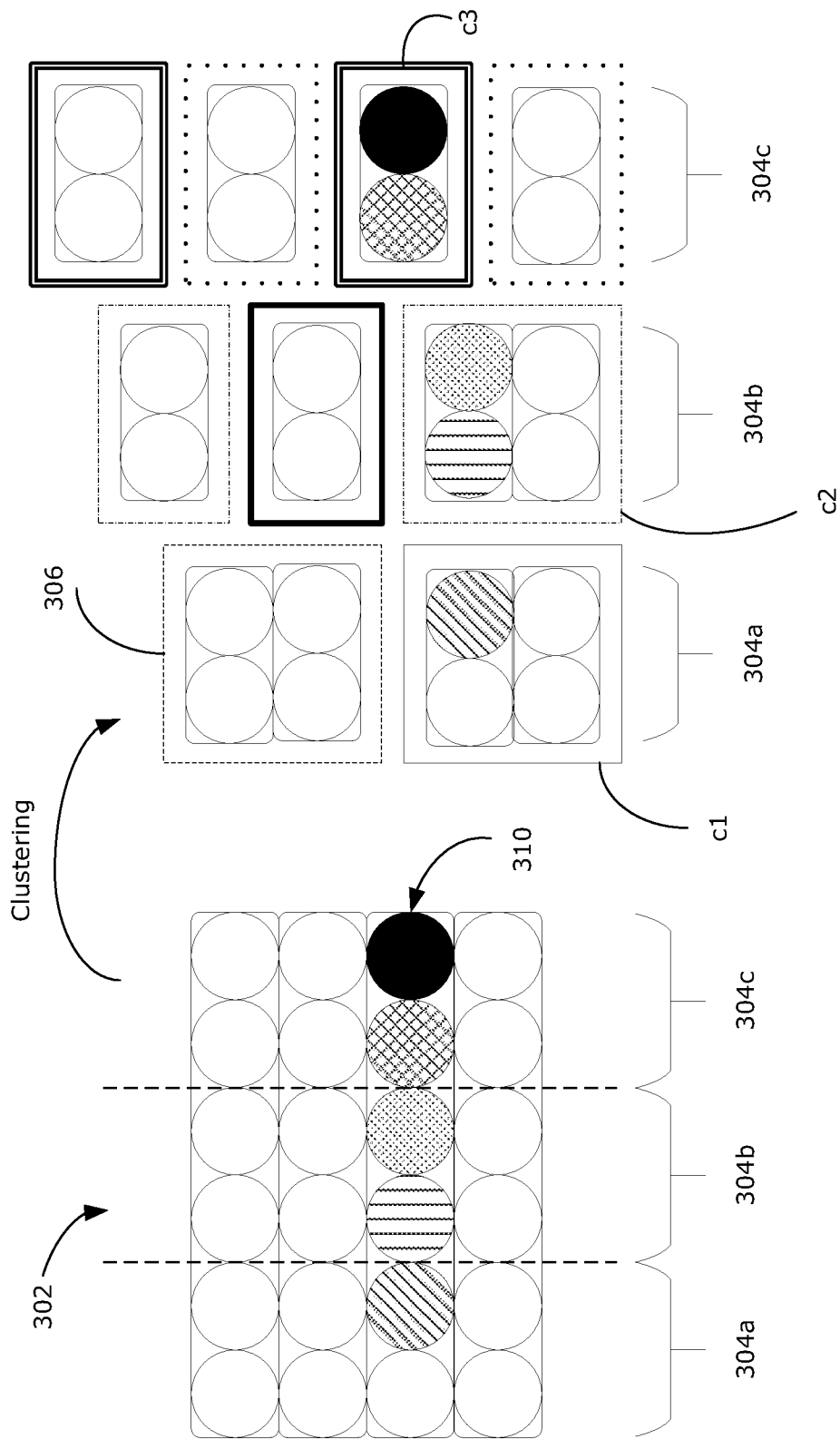
FIG. 3 illustrates an example of how clusters are formed in a PQ-based compression technique.

FIG. 3 shows an illustration of the PQ technique on an embedding matrix 302 of size $E \in R^{4 \times 6}$. For simplicity, the dimension weights are indicated (using different shading) for only one row of the embedding matrix 302, however it should be understood that each row of the embedding matrix 302 contains a set of dimension weights that represent a corresponding token. In this example, the embedding matrix 302 is first partitioned (indicated by dashed lines) into three submatrices 304a, 304b, 304c (generally referred to as submatrices 304). Each submatrix consists of sub-vectors from each embedding vector (i.e., each embedding vector corresponding to each row of the embedding matrix 302). Each sub-vector has a length of two. Clustering is then performed (e.g., using K-means clustering) to cluster the rows of each submatrix 304 into two clusters 306 (different clusters 306 being represented by boxes of different line quality, where boxes of the same line quality indicate elements belonging to the same cluster 306). Thus, six clusters 306 are obtained (i.e., two clusters 306 for each of three submatrices 304). It should be noted that a given cluster 306 may include non-adjacent rows of a submatrix 304 (e.g., as in indicated in submatrix 304b and submatrix 304c), different clusters 306 may be of different sizes (i.e., having different numbers of elements), and submatrices 304 may have different number of clusters.

After performing clustering, the centroid for each cluster 306 in each submatrix 304 is computed and stored. The computed centroid has the same dimensionality as the sub-vectors belonging to the cluster 306. That is, for a cluster 306 having sub-vectors with dimension $$\frac{n}{g},$$

the computed centroid also has dimension $$\frac{n}{g}.$$

In the example of FIG. 3, the computed centroid for each cluster 306 has a dimension of two. For a given submatrix 304, centroids are computed for all c clusters 306, and the centroids are stored in a centroid vector $$u^{ji} \in R^{\frac{n}{g}},$$

where j is the index of the cluster in the i-th submatrix 304. Thus, there are g centroid submatrices, which may be stored together in the centroid matrix $U_{\in R^{c \times n}} = [u^1, \ldots, u^g]$ where $$u^i \in R^{c \times \frac{n}{g}}.$$

In order to reconstruct the embedding matrix E, a quantization matrix Q is also stored, where $Q \in N^{|V| \times g}$. The quantization matrix Q is a mapping that maps each embedding vector to a particular cluster number in each of the submatrices $G_i$. For example, in FIG. 3, the embedding vector 310 can be mapped to the cluster c1 in submatrix 304a, the cluster c2 in submatrix 304b, and the cluster c3 in the submatrix 304c. The embedding vector 310 can be reconstructed using the centroid of c1 for the first two dimensions, the centroid of c2 for the middle two dimensions, and the centroid of c3 for the last two dimensions.

Accordingly, the matrix E can be reconstructed (as an approximation) using only the quantization matrix Q and the centroid matrix U. The compression ratio for this compression (assuming k bits are used to represent floating point values for each weight of the embedding vectors) is given by the following equation:

$$\text{Compression Ratio} = \frac{c \times n \times k + |V| \times g \times \log_2 g}{|V| \times n \times k}$$

As will be appreciated from the above discussion, some information is lost during the compression. Although some loss of information may be acceptable and expected when the embedding matrix is compressed, the use of conventional PQ techniques may result in loss of information that negatively impact the performance of a trained NLP model that learns the compressed embedding matrix for performing a learned NLP task. For example, conventional PQ techniques do not take into account the non-uniform distribution of tokens in the corpus vocabulary, in which some tokens may appear at higher frequency or may be of higher importance compared to others. Another drawback of conventional PQ techniques is that the centroid of each cluster is computed as the fixed representation of all elements of the cluster. However, there may be variance among the element values in the cluster, and this information is lost in conventional PQ compression. The result of such drawbacks is that the performance-to-compression ratio may be lower than expected.

Another existing technique for compression of an embedding matrix is known as GroupReduce, which is a singular value decomposition (SVD) based technique. GroupReduce first groups words in the embedding matrix E based upon the square root of frequency of occurrence in the corpus, and then applies weighted SVD on each grouped block. This allows for compression of the embedding matrix. Finally, the last step in GroupReduce is to refine the word group assignment by reducing the reconstruction error. However, GroupReduce, being an SVD based technique, has been found to have worse performance in terms of compression-to-quality ratio when compared to conventional PQ techniques. GroupReduce is dependent on corpus-level word-frequency to define the relative importance of embedding vectors, which limits applicability to only compression of embedding matrices in neural networks for NLP. For example, GroupReduce cannot be applied to compression of other internal or hidden layers of neural networks.

The present disclosure describes a PQ-based compression technique, which has been found to have better performance than SVD techniques and that helps to overcome some of the drawbacks of conventional PQ techniques.

Example methods and systems described herein provide a way to capture and preserve information about variance, which is lost in conventional PQ compression. In neural networks, the computations performed by each layer of the neural network may be represented by y=f(Wx), where x is an input vector, y is an output vector, f is an activation function, and W is a matrix that includes elements that are parameters whose values are learned through back-propagation algorithm. Similar to other types of matrices, matrices in neural networks contain variance information. The examples disclosed herein enable incorporation of such information after compression.

Example methods and systems described herein also provide a way to capture and preserve information about relative importance of embedding vectors. In NLP applications such as recommendation systems, machine translation, automatic speech recognition and many others, tokens of the vocabulary are not distributed uniformly. This non-uniform distribution should be taken into consideration when compressing embedding matrices for NLP applications, to achieve more accurate performance of the NLP task (e.g., when compared to performance of the same NLP task using non-compressed data as input). Non-uniform distribution of tokens implies that not all embedding vectors are equally important. Therefore, it may be beneficial to compress less (i.e., represent using more data bits) the embedding vectors of those tokens which are more important for the task so that less information is lost. On the other hand, the embedding vectors of less important tokens may be compressed more (i.e., represented using fewer data bits). Thus, a balance between compression and performance may be achieved. The present disclosure also describes a way to determine relative importance of vectors, which may be general enough to be applicable to any matrix in neural networks and not be limited to embedding vectors and embedding matrices.

Figure 4:
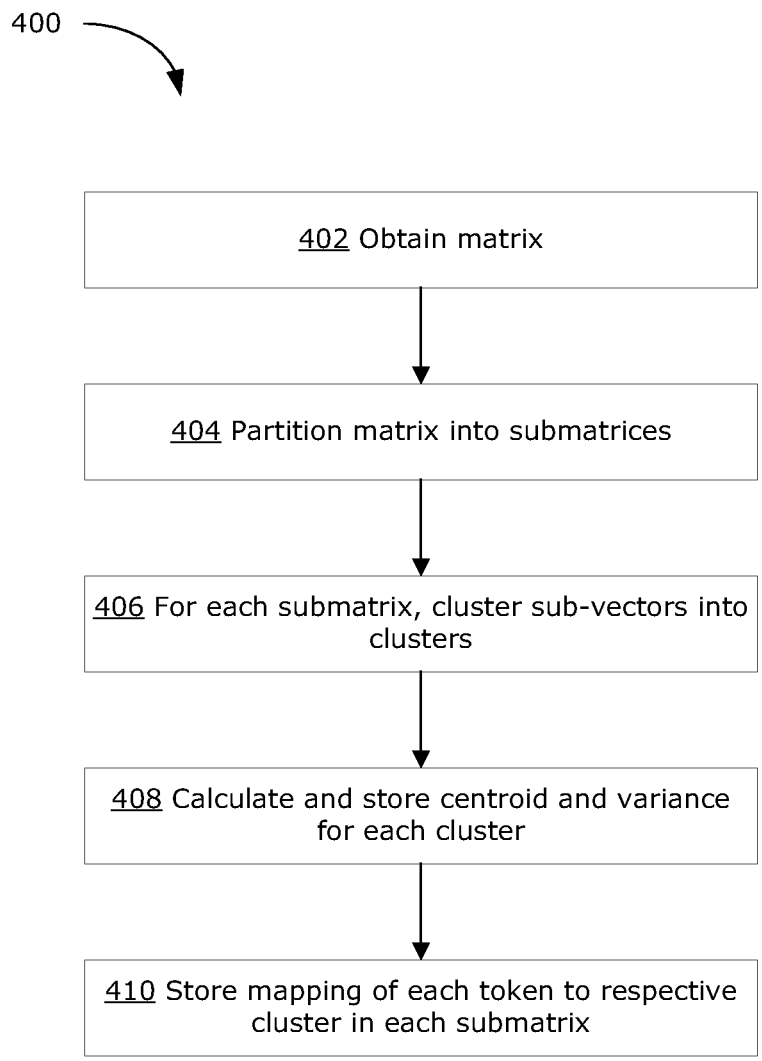
FIG. 4 is a flowchart of an example disclosed method for compressing a matrix.

FIG. 4 is a flowchart illustrating an example method 400 for performing compression of a matrix. The method 400 may be performed by the computing system 100 of FIG. 1, for example using instructions stored in the module for PQ-based compression 150. Although referred to as PQ-based compression, it should be understood that the disclosed method 400 is not equivalent to conventional PQ compression techniques. As will be appreciated following the discussion below, the disclosed method 400 captures a different set of information and decompresses the compressed data (i.e., reconstructs the compressed matrix) in a manner different from conventional PQ compression techniques. In particular, the method 400 stores stochastic information about each cluster (e.g., both mean and variance information), and uses this stochastic information to reconstruct the cluster elements by sampling from a Gaussian distribution. The following discussion is provided in the context of compression of an embedding matrix. However, it should be understood that this is provided only as an illustration and the compression technique described below may be used for compression of any matrix.

The method 400 begins at 402 with obtaining an embedding matrix E. Obtaining the embedding matrix E may include receiving the embedding matrix E from another computing system (e.g., from an external database storing the embedding matrix), or may include retrieving the embedding matrix E from a memory of the computing system 100 (e.g., in the case where the embedding matrix E was previously generated by the computing system 100 itself from the vocabulary of a corpus). The embedding matrix E is defined as a matrix E$\in \mathbb{R}^{(|V|\times n)}$ where V is the vocabulary set and n is the dimension of each embedding vector.

At 404, the embedding matrix E is decomposed or partitioned into g submatrices, each submatrix being one or more columns of the embedding matrix E. The partitioning may be uniform, such that all submatrices are of equal size (i.e., equal numbers of columns and rows), and each submatrix is formed by respective one or more contiguous columns of the embedding matrix E. Each submatrix may be denoted as $G_i$ where i is an integer, $1 \leq i \leq g$. The set of submatrices may be expressed as $[G_1, \ldots, G_g]$ where $$G_i \in R^{|V| \times \frac{n}{g}}.$$

At 406, the sub-vectors in each submatrix $G_i, 1 \leq i \leq g$ are clustered into c clusters. In some examples, the number of clusters formed in each submatrix $G_i$ may not be equal across all submatrices. Any suitable clustering algorithm may be used for performing this clustering. For example, a K-means clustering algorithm may be used. In some examples, a weighted K-means clustering algorithm may be used, as discussed further below.

At 408, the centroid of each given cluster is computed, as well as the variance of all sub-vectors belonging to the given cluster. The centroids and variances are stored. It should be noted that the centroid and variance computed for a given cluster has the same dimensionality as the sub-vectors belonging to the cluster. For example, where the sub-vectors have dimensionality $$\frac{n}{g},$$

the centroid and variance also have dimensionality $$\frac{n}{g}.$$

The centroids computed for all clusters over all submatrices may be represented as $$u^{ji} \in R^{\frac{n}{g}},$$

where j is the index of the cluster in the i-th submatrix ($1 \leq j \leq c$ and $1 \leq i \leq g$). Additionally, the variance computed for all clusters over all submatrices may be represented as $$v^{ji} \in R^{\frac{n}{g}},$$

where j is the index of the cluster in the i-th submatrix ($1 \leq j \leq c$ and $1 \leq i \leq g$). That is, the centroid and variance computed for a given cluster in a given submatrix may be identified by the index pair (j,i). The centroids may be stored together with the variances, or may be stored separately.

At 410, the mapping of each word in the vocabulary set V to the respective cluster in each submatrix is also generated and stored. The stored mapping indicates, for a given word, the cluster indices for all sub-vectors (indicating which cluster to select the centroid and variance from), in order to reconstruct each sub-vector, and concatenating them to reconstruct the embedding vector for the given word. This mapping may be stored in a quantization matrix Q, where $Q \in N^{|V| \times g}$.

It should be understood that the steps of the method 400 may be performed in an order different from that shown. For example, the mapping may be generated and stored at any point during or following the clustering at step 406.

The result of the method 400 is stored compressed data including a set of centroids, indexed by cluster number (j) and submatrix number (i); a set of variances, indexed by cluster number (j) and submatrix number (i); and a mapping of each token to a set of index pairs, indicating the relevant cluster from each submatrix. As will be discussed further below, the embedding matrix can be reconstructed as a concatenation of sub-vectors reconstructed using this compressed data.

The compressed data generated by the method 400 may be stored in the computing system 100 for later processing (e.g., further used by a trained NLP model for performing a learned NLP task). Alternatively or additionally, the compressed data may be communicated by the computing system 100 to another device (e.g., a handheld or mobile device, or other end user device) to be used to perform a NLP task. It should be appreciated that the compressed data generated by the method 400 compresses the embedding matrix, such that the memory requirements for storing the compressed data and/or the transmission resources required for communicating the compressed data are lower than those required for storing and/or communicating the original embedding matrix.

Figure 5:
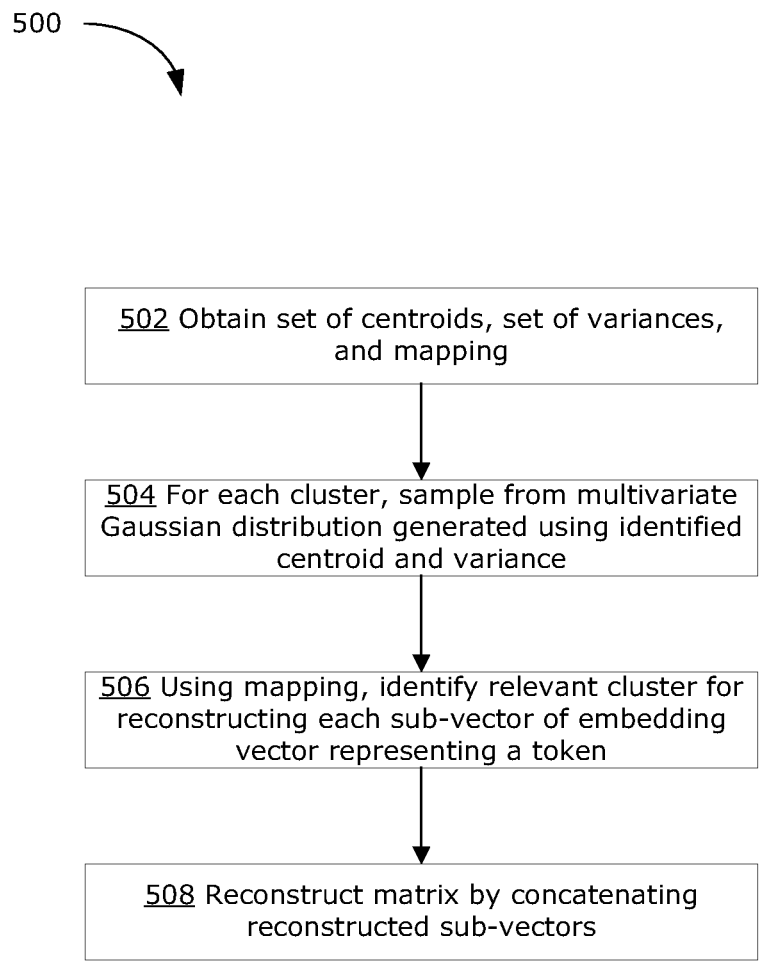
FIG. 5 is a flowchart of an example disclosed method for reconstructing a matrix.

FIG. 5 is a flowchart illustrating an example method 500 for decompressing the compressed data generated by the method 400. Decompressing the compressed data may also be referred to as reconstructing the compressed matrix. The method 500 may be performed by the computing system 100 of FIG. 1, for example using instructions stored in the module for PQ-based decompression 160. It should be noted that the same device (e.g., the computing system 100) may perform both the method 400 and the method 500, in which case the device may store instructions for both PQ-based compression 150 and PQ-based decompression 160. Alternatively, the method 400 and the method 500 may be performed by different devices (each of which may be a computing system 100), in which case the compressing device may store only instructions for PQ-based compression 150 and the decompressing device may store only instructions for PQ-based decompression 160.

The following discussion is provided in the context of reconstruction of an embedding matrix. However, it should be understood that this is provided only as an illustration and the reconstruction technique described below may be used for reconstruction of any matrix that was compressed using the method 400.

At 502, the compressed data is obtained, including the set of centroids, indexed by cluster number (j) and submatrix number (i); the set of variances, indexed by cluster number (j) and submatrix number (i); and the mapping of each token to a set of index pairs, indicating the relevant cluster from each submatrix. Obtaining the compressed data may include receiving the compressed data from another computing system (e.g., from another computing system that performed the method 400), or may include retrieving the compressed data from a memory of the same computing system 100 (e.g., in the case where the same computing system 100 performs both the method 400 and the method 500).

At 504, to reconstruct each cluster, a continuous distribution (e.g., a multivariate Gaussian distribution) is generated using the relevant centroid and the relevant variance. For example, each cluster may be indexed by an index pair (j,i), indicating a given cluster (j) in a given submatrix (i). The relevant centroid is then the centroid in the set of centroids that is indexed to this index pair, namely $u^{ji}$; and the relevant variance is the variance in the set of convariances that is index to this index pair, namely $v^{ji}$. The multivariate Gaussian distribution for the given cluster at index pair (j,i) may then be generated as follows:

$$GD^{ji} \sim \mathcal{N}(u^{ji}, v^{ji})$$

The given cluster may then be reconstructed by sampling a vector from $GD^{ji}$. The sampled vector is used as the reconstructed centroid $\hat{u}^{ji}$ of the reconstructed cluster. Although a multivariate Gaussian distribution is described here as an example, other continuous distributions may be used instead.

At 506, the mapping is used to identify, for each word in the vocabulary set V, the relevant clusters for reconstructing the embedding vector that represents the word. Each relevant cluster corresponds to a respective sub-vector of the embedding vector. For example, the mapping may be a quantization matrix Q that maps each word in the vocabulary to a cluster index, where each cluster index indicates the index pair (j,i) of the relevant cluster for a sub-vector of the embedding vector. The reconstructed centroid $\hat{u}^{ji}$ of the relevant cluster may then be used to reconstruct each sub-vector.

At 508, the embedding vector may be reconstructed by concatenating, in the appropriate order, all the reconstructed sub-vectors. In a similar manner, the entire embedding matrix may be reconstructed by concatenating, in the appropriate order, the reconstructed centroids corresponding to each sub-vector.

It should be understood that the steps of the method 500 may be performed in an order different from that shown, and the exact order of concatenation may be varied. For example, the embedding matrix may be reconstructed by first reconstructing each embedding vector (i.e., each row of the embedding matrix) by concatenating the sub-vectors for each embedding vector, and then concatenating the embedding vectors together to form the embedding matrix. Alternatively the embedding matrix may be reconstructed by first reconstructing each submatrix by concatenating the sub-vectors belonging to the same submatrix, and then concatenating the submatrices to form the embedding matrix.

The reconstructed embedding matrix may be used to replace the weights of the embedding matrix, which is learned by a trained NLP model, for example to perform a NLP task (e.g., a translation task). Additionally, the reconstruction method 500 could also be incorporated within the machine learning algorithm, for example by modifying the architecture of the neural network such that the trained neural network performs the reconstruction as a learned task.

Figure 6:
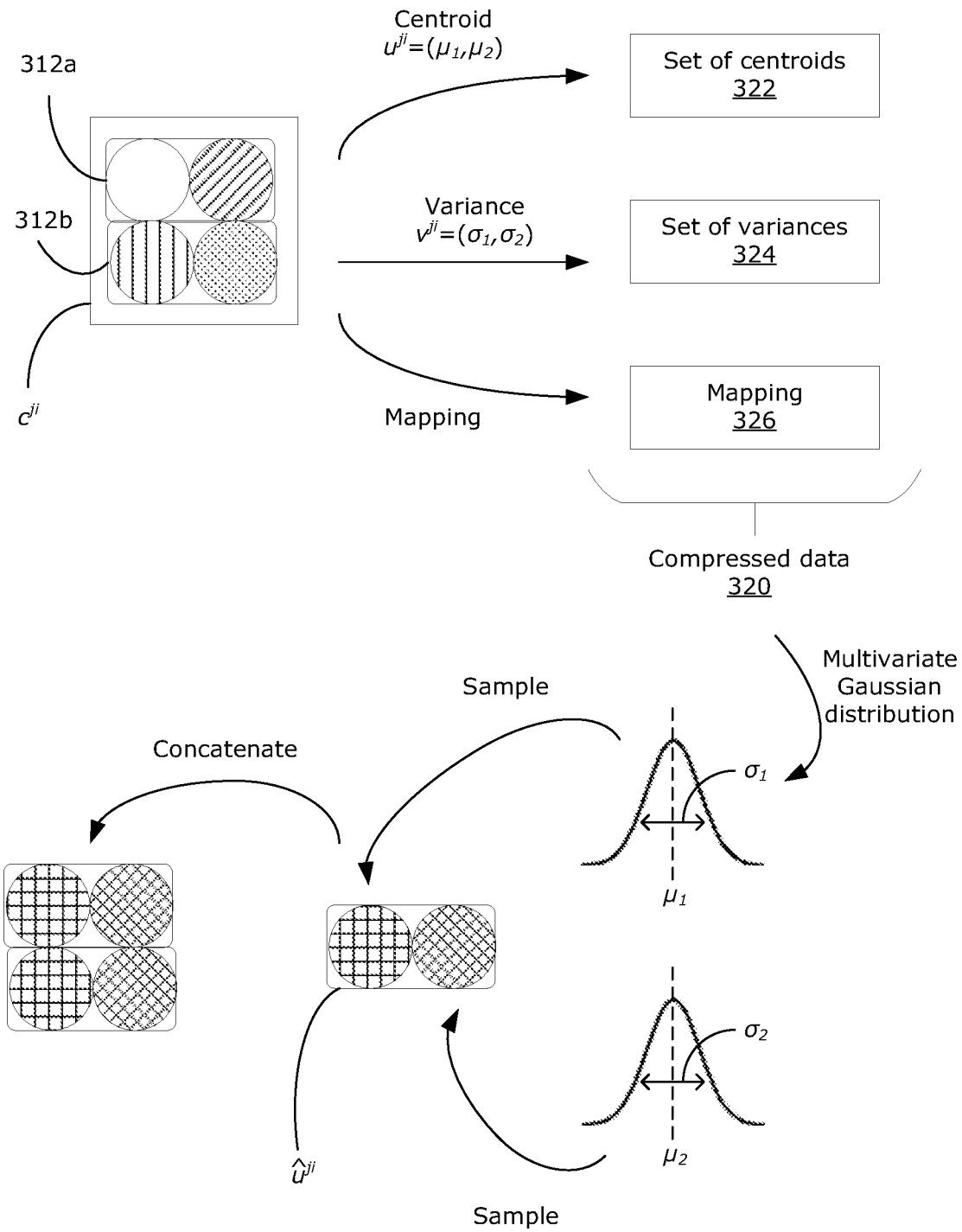
FIG. 6 illustrates an example implementation of the compression and reconstruction methods of FIGS. 4 and 5.

FIG. 6 is a simplified graphical illustration of the matrix compression performed using the method 400, and the decompression (or matrix reconstruction) performed using the method 500. It should be understood that the compression and decompression illustrated in FIG. 6 may be performed by separate devices, as discussed previously.

FIG. 6 illustrates the compression process after clustering has been performed (e.g., following step 406 of the method 400, and illustrates the decompression process up to concatenating sub-vectors of a reconstructed cluster (e.g., up to step 508 of the method 500). In this simple example, the compression and reconstruction of a single cluster is shown. However, it should be understood that the compression and reconstruction of a single cluster is demonstrative of the compression and reconstructions of a larger matrix to which the cluster belongs.

In FIG. 6, the j-th cluster of the i-th submatrix is shown, denoted as $c^{ji}$. In this example, the cluster $c^{ji}$ is formed by two sub-vectors 312a, 312b having 2 dimensions. Different shading indicates the different dimension weights in each sub-vector 312a, 312b. The centroid, denoted as $u^{ji}$, and variance, denoted as $v^{ji}$, of the cluster $c^{ji}$ are computed and stored in the set of centroids 322 and the set of variances 324, respectively, and indexed by the index pair (j,i) corresponding to the cluster $c^{ji}$ (e.g., corresponding to step 408 of the method 400). In particular, because the sub-vectors 312a, 312b belonging to the cluster $c^{ji}$ has 2 dimensions, the centroid $u^{ji}$ and variance $v^{ji}$ also have two dimensions. For example, the centroid $u^{ji}$ may be represented as:

$$u^{ji}=(\mu_1,\mu_2)$$

and the variance $v^{ji}$ may be represented as:

$$v^{ji}=(\sigma_1,\sigma_2)$$

The relationship of each sub-vector 312a, 312b to the corresponding cluster $c^{ji}$ is also stored in the mapping 326 (e.g., corresponding to step 410 of the method 400). After processing all clusters over the entire matrix, the set of centroids 322, set of variances 324 and mapping 326 together form a set of compressed data 320 for the matrix. This compressed data 320 may be stored for future use by the same computing system and/or may be communicated to another computing system, as discussed previously.

FIG. 6 illustrates reconstruction of the single cluster $c^{ji}$ using the compressed data 320. Using the index pair (j,i), the centroid $u^{ji}$ and variance $v^{ji}$ for the cluster $c^{ji}$ are identified from the set of centroids 322 and the set of variances 324, respectively. The centroid and variance $v^{ji}$ are used to generate a multivariate Gaussian distribution (in this example, having Gaussian distributions in two dimensions). The multivariate Gaussian distribution is sampled, and the sampled vector is used as the reconstructed centroid, denoted as $\hat{u}^{ji}$, to reconstruct the cluster $c^{ji}$ (e.g., corresponding to step 504 of the method 500). Different shading is used to indicate the different sampled dimension weights of the reconstructed centroid $\hat{u}^{ji}$. It should be noted that the reconstructed centroid $\hat{u}^{ji}$ is not necessarily equal to the originally computed centroid $u^{ji}$ Using the mapping 326, the sub-vectors corresponding to the cluster $c^{ji}$ are identified, and the sub-vectors can be reconstructed using the reconstructed centroid $\hat{u}^{ji}$ (e.g., corresponding to step 506 of the method 500). The reconstructed sub-vectors can then be concatenated to reconstruct the cluster (and similarly reconstruct the entire matrix) (e.g., corresponding to step 508 of the method 500).

As mentioned previously, the clustering technique that is used to cluster sub-vectors in each submatrix (e.g., at step 406 of method 400) may be K-means clustering. In some examples, a weighted K-means clustering technique may be used. In examples described below, the element weights are defined in such a way as to capture the relative importance of the elements within a cluster. For example, each sub-vector belonging to a given cluster in a submatrix is considered to be an element of the given cluster. Weighting of the elements then means the weighting assigned to each sub-vector of the given cluster, to control the relative influence of each sub-vector on the computed centroid of the given cluster. It should be understood that although the weighted K-means clustering disclosed herein is described in the context of the disclosed compression technique, the disclosed weighted K-means clustering technique may be used in other contexts, for example the weighted K-means clustering disclosed herein may be used for clustering in any PQ-based techniques (including conventional PQ compression). The following disclosed definition of element weights may be suitable for any algorithm that incorporates frequency information in PQ-based approaches through any algorithm that applies weights for performing static or dynamic clustering, for example.

For the following discussion, the weighted K-means clustering may be formulated as an expectation maximization (EM) procedure. The following describes an example procedure for clustering a set of vectors x into c clusters, where $x_i$ represents the $i^{th}$ vector in the set x and $\mu_k$ represents the centroid of the $k^{th}$ cluster:

$$z_i^* = \underset{k}{\text{argmax}}\ p(z_i = k|x, \mu_1 \dots \mu_c)$$

In the expectation step (E-step) of the EM procedure, each element is assigned to the closest mean (or centroid) of a cluster. The expectation step updates may be formulated as:

$$z_i^* = \underset{k}{\text{argmin}}\ \|x_i - \mu_k\|_2^2$$

In the maximization step (M-step) of the EM procedure, the mean (or centroid) of each cluster is recomputed based on the elements that have been assigned to each cluster. The maximization step updates may be formulated as:

$$\mu_k = \frac{1}{N_k}\sum_{i:z_i=k}\alpha(i)x_i$$

In the above equations, $\mu_k$ represents the mean of the k-th cluster, $z_i$ stores the cluster mappings that map the i-th element to the k-th cluster, $N_k$ is the number of elements in the k-th cluster. Notably, the cluster mean is weighted by the element weight $\alpha(i)$ for the i-th element. In the present disclosure, the element weight is defined in order to capture the relative importance of the i-th element within the cluster.

For example, the element weight may be defined as the square root of the frequency of a given token in the corpus. This may be expressed as: $\alpha(i)=\sqrt{f_i}$, where $f_i$ is the frequency of the i-th token in the corpus. Such a definition for the element weight may be useful in the context of embedding matrices, for example. In the context of other matrices, the element weight for a given vector of the matrix may be based on frequency of a corresponding token in a source dataset, for example.

In another example, which may be useful for compression of matrices other than embedding matrices, the element weight may be defined as the Euclidean norm of the matrix rows. For example, for the embedding matrix E, the element weight may be defined as $\alpha(i)=\|E_i\|_2$, which represents the Euclidian norm of the $i^{th}$ row of the matrix E. As mentioned above, this computation may be similarly performed for any other matrix, and is not limited to the embedding matrix E.

Generally, the Euclidian norm may be a good proxy for weighing the relative importance of row vectors in a matrix, for neural network applications, because important trainable parameters in a neural network tend to change more often and are more probable to have higher norm values.

By applying an element weight (e.g., defined based on frequency or based on the Euclidian norm), clusters may be formed in such a way that elements that are of greater relative importance have greater influence on the computed cluster centroid. The weighted K-means clustering technique, using element weights defined by frequency or defined by Euclidian norm, may be incorporated into the compression method disclosed herein. For example, the weighted K-means clustering may be used at step 406 of the method 400. Thus, the disclosed weighted K-means clustering technique enables non-uniform quantization, which may enable greater focus on different vectors, based upon their relative importance (as represented by their relative element weights). In particular, the use of the Euclidian norm to define element weights enables the disclosed weighted K-means clustering technique to be used independently of the frequency of the words in a corpus. This enables the weighted K-means technique to be more widely applicable to different matrices, including hidden layers in a neural network.

In various example simulations, it has been found that examples of the compression and reconstruction techniques described herein, whether using regular K-means clustering or using the disclosed weighted K-means clustering, have better compression-to-quality ratio than existing techniques for compressing an embedding matrix. For example, based in the size of the compressed data and the bilingual evaluation understudy (BLEU) score, a neural network trained to perform a machine translation (e.g., machine translation of English-to-French, machine translation of English-to-German) had better compression-to-quality ratio when using data compressed using the disclosed technique, compared to conventional PQ compression and GroupReduce techniques.

In various examples, the present disclosure describes methods and systems that enable stochastic modelling of a cluster (e.g., by including variance information in the compressed data), which may provide more useful information for input to machine learning algorithms.

The present disclosure also describes different functions for defining element weights, which may be used for weighted K-means clustering, or other weighted clustering techniques.

Although examples have been presented in the context of embedding matrices for NLP tasks, examples of the present disclosure may be adapted for compression of any matrix, including matrices used in deep neural networks.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute example embodiments of the methods disclosed herein. The machine-executable instructions may be in the form of code sequences, configuration information, or other data, which, when executed, cause a machine (e.g., a processor or other processing device) to perform steps in a method according to example embodiments of the present disclosure.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A computing system comprising:
a memory; and
a processing device in communication with the memory, the processing device configured to execute instructions to cause the computing system to compress a matrix including:
partition the matrix, having a plurality of rows formed by a respective plurality of vectors, into a plurality of submatrices, each submatrix containing sub-vectors from a respective group of one or more contiguous columns of the matrix;
for each given submatrix, cluster the sub-vectors of the given submatrix into a plurality of clusters;

for each given cluster, compute and store, in the memory, a centroid and a variance based on the sub-vectors belonging to the given cluster; and store, in the memory, a mapping relating each vector to a respective cluster in each submatrix;

wherein the stored centroids, stored variances and stored mapping form a set of compressed data for reconstruction of the matrix, the set of compressed data requiring fewer bits to store in the memory than the matrix prior to compression.

2. The computing system of claim 1, wherein the matrix is an embedding matrix, and the plurality of vectors is a plurality of embedding vectors, each embedding vector being a vector representation of a respective token in a vocabulary of a corpus.

3. The computing system of claim 1, wherein the matrix is a layer of a neural network, and the plurality of vectors are trainable parameters of the neural network.

4. The computing system of claim 1, wherein the processing device is configured to execute the instructions to cause the computing system to cluster the sub-vectors using K-means clustering.

5. The computing system of claim 1, wherein the processing device is configured to execute the instructions to cause the computing system to cluster the sub-vectors using weighted K-means clustering, and wherein the centroid of each given cluster is computed using element weights to weight each sub-vector of the given cluster.

6. The computing system of claim 5, wherein each vector of the matrix represents a respective token in a source dataset, and the element weight for each respective sub-vector of the given cluster is defined based on frequency of the corresponding token in the source dataset.

7. The computing system of claim 5, wherein the element weight for each respective sub-vector of the given cluster is defined based on a Euclidian norm of a corresponding vector in the matrix.

8. The computing system of claim 1, wherein the processing device is configured to execute the instructions to cause the computing system to:

communicate the set of compressed data to another device, the set of compressed data to be used as input for performing a machine learning task.

9. A computing system comprising:

a memory; and a processing device in communication with the memory, the processing device configured to execute instructions to cause the computing system to:

obtain a set of compressed data for reconstruction of a matrix, the set of compressed data including a set of centroids and a set of variances, each centroid being associated with a respective cluster, and each variance being associated with a respective cluster, the set of compressed data further including a mapping relating each sub-vector of the matrix to a respective cluster;

for each given cluster, generate a reconstructed centroid by sampling from a distribution, the distribution being generated using the centroid and the variance associated with the given cluster;

reconstruct each given sub-vector using the reconstructed centroid generated for a relevant cluster, the relevant cluster for the given sub-vector being identified using the mapping;

reconstruct the matrix by concatenating the reconstructed sub-vectors; and provide the reconstructed matrix as input to a neural network for performing a machine learning task.

10. The computing system of claim 9, wherein the distribution is a multivariate Gaussian distribution.

11. The computing system of claim 9, wherein the set of compressed data is obtained in a communication from another device.

12. The computing system of claim 9, wherein the matrix is an embedding matrix.

13. A method for compressing a matrix, the method comprising:

partitioning the matrix, having a plurality of rows formed by a respective plurality of vectors, into a plurality of submatrices, each submatrix containing sub-vectors from a respective group of one or more contiguous columns of the matrix;

for each given submatrix, clustering the sub-vectors of the given submatrix into a plurality of clusters;

for each given cluster, computing and storing, in a memory of a computing system, a centroid and a variance based on the sub-vectors belonging to the given cluster; and storing, in the memory, a mapping relating each vector to a respective cluster in each submatrix;

wherein the stored centroids, stored variances and stored mapping form a set of compressed data for reconstruction of the matrix, the set of compressed data requiring fewer bits to store in the memory than the matrix prior to compression.

14. The method of claim 13, wherein the matrix is an embedding matrix, and the plurality of vectors is a plurality of embedding vectors, each embedding vector being a vector representation of a respective token in a vocabulary of a corpus.

15. The method of claim 13, wherein the matrix is a layer of a neural network, and the plurality of vectors are trainable parameters of the neural network.

16. The method of claim 13, wherein the sub-vectors are clustered using K-means clustering.

17. The method of claim 13, wherein the sub-vectors are clustered using weighted K-means clustering, and wherein the centroid of each given cluster is computed using element weights to weight each sub-vector of the given cluster.

18. The method of claim 17, wherein each vector of the matrix represents a respective token in a source dataset, and the element weight for each respective sub-vector of the given cluster is defined based on frequency of the corresponding token in the source dataset.

19. The method of claim 17, wherein the element weight for each respective sub-vector of the given cluster is defined based on a Euclidian norm of a corresponding vector in the matrix.

20. The method of claim 13, further comprising:

communicating the set of compressed data to another device, the set of compressed data to be used as input for performing a machine learning task.

* * * * *